United States Patent
Uchida et al.

(10) Patent No.: US 6,545,408 B2
(45) Date of Patent: Apr. 8, 2003

(54) ORGANIC ELECTROLUMINESCENT LIGHT SOURCE

(75) Inventors: Masahiro Uchida, Fujimi-machi (JP); Tatsuaki Funamoto, Chino (JP); Osamu Yokoyama, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 57 days.

(21) Appl. No.: 09/790,547

(22) Filed: Feb. 23, 2001

(65) Prior Publication Data

US 2001/0020818 A1 Sep. 13, 2001

(30) Foreign Application Priority Data

Feb. 24, 2000 (JP) .................................. 2000-048043

(51) Int. Cl.[7] ............................................. H05B 33/14
(52) U.S. Cl. ........................................ 313/504; 313/506
(58) Field of Search .................................. 313/504, 503, 313/506, 509, 113

(56) References Cited

U.S. PATENT DOCUMENTS 5,142,192 A * 8/1992 Takahashi et al. ...... 313/506 X
6,125,226 A * 9/2000 Forrest et al. .............. 313/504
6,366,016 B1 * 4/2002 Sakaguchi et al. ...... 313/504 X
2002/0033664 A1 * 3/2002 Kobayashi .................. 313/504

FOREIGN PATENT DOCUMENTS

JP          A-10-50124          2/1998

* cited by examiner

Primary Examiner—Sophia S. Chen
(74) Attorney, Agent, or Firm—Oliff & Berridge, PLC

(57) ABSTRACT

The invention provides a linear organic electroluminescent light source which is high in brightness and capable of realizing white color. A brighter light source can be obtained compared with a light source having only one organic electroluminescent element by forming the organic electroluminescent element to have at least one organic layer, which emits light, on both sides of a transparent substrate, and covering the transparent substrate with a mirror which is high in reflectance except one end face of the transparent substrate. When the same brightness as that of a light source having one element is obtained, the power consumption can be suppressed. The light source can thus emit white light.

8 Claims, 4 Drawing Sheets

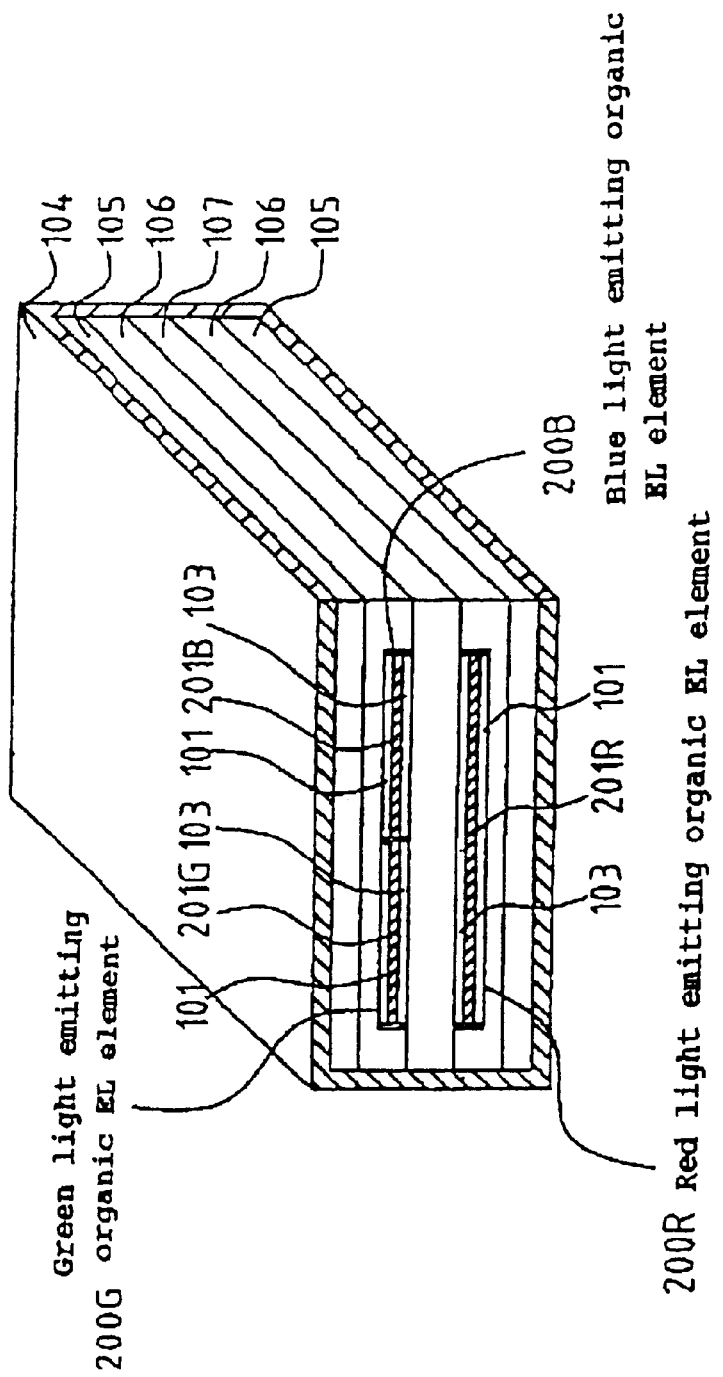
[FIG. 2]

[FIG. 3]
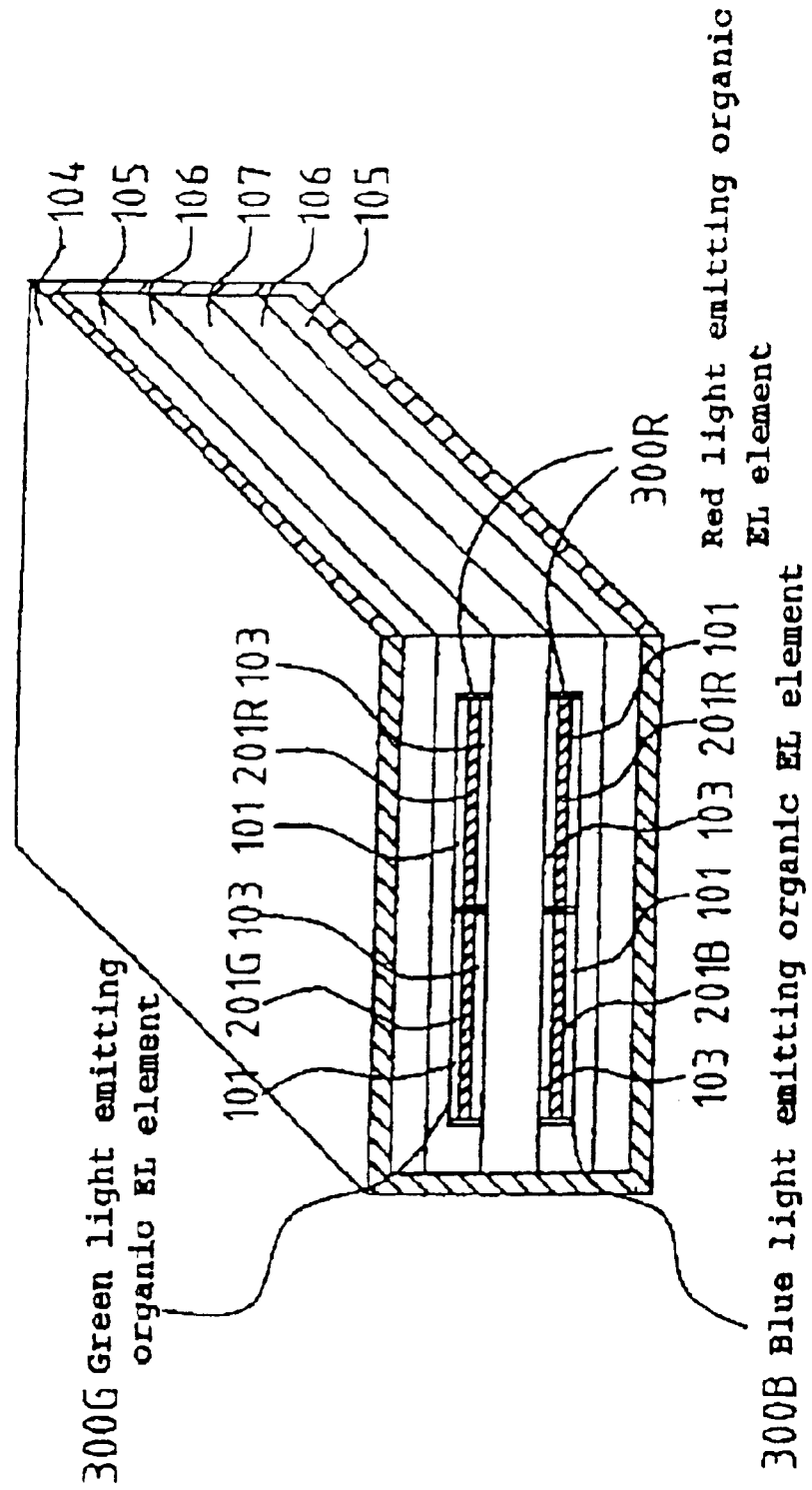

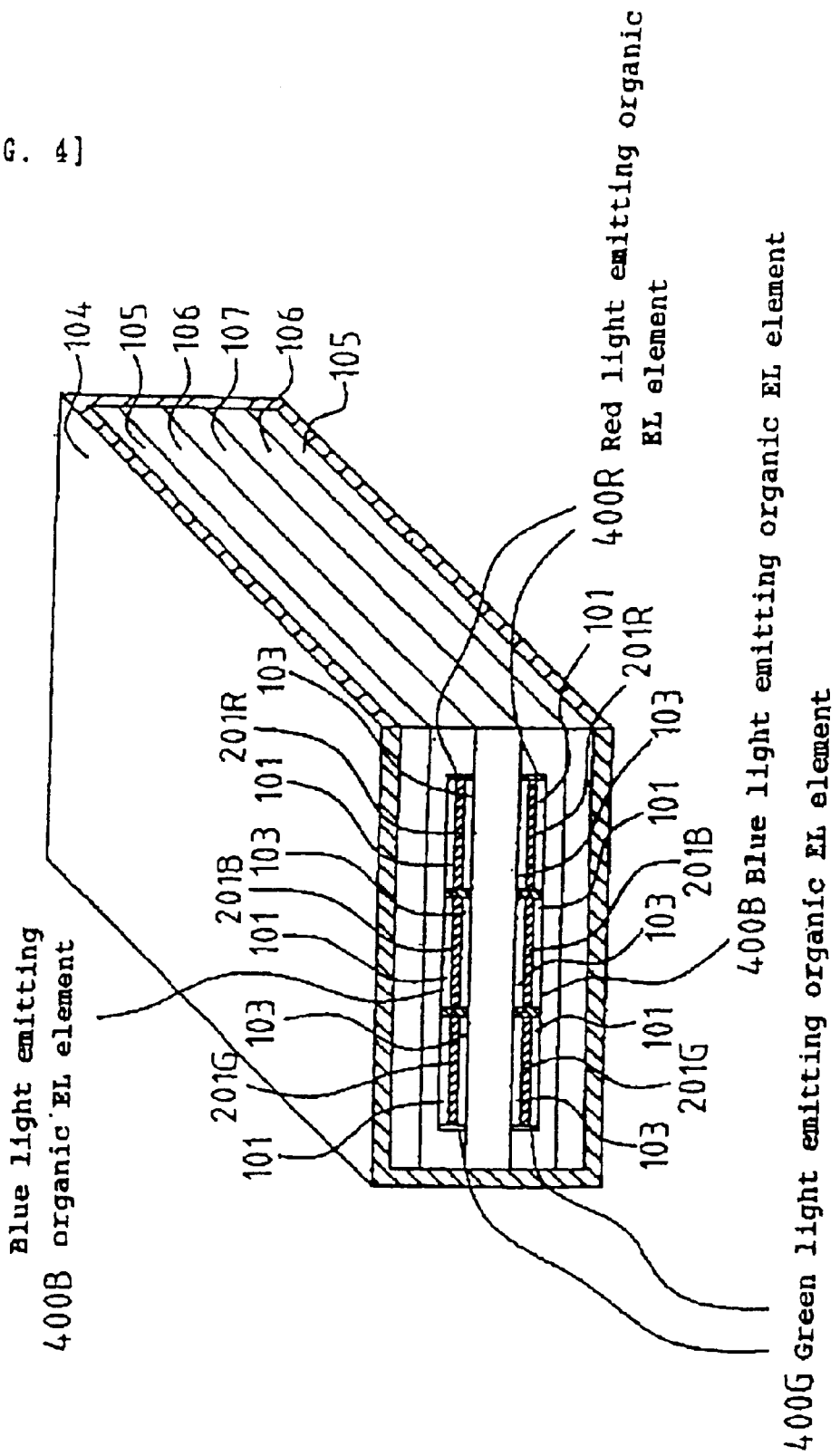
[FIG. 4]

ORGANIC ELECTROLUMINESCENT LIGHT SOURCE

BACKGROUND OF THE INVENTION

1. Field of Invention

The present invention relates to a light source using an organic electroluminescent (hereinafter, referred to as "EL") element.

2. Description of Related Art

An organic thin film EL element, that is provided with a laminate body in which at least one organic light emitting layer is interposed between an anode and a cathode, can considerably reduce the applied voltage, as compared with an inorganic EL element. Development for the purpose of obtaining an organic EL element having enhanced performance has been actively advanced through developments and improvements. Elements of various colors of light and elements high in brightness and efficiency have already been developed for organic thin film EL elements, and their use for pixels of display devices and light sources have been implemented.

The technology to reduce the profile of an illumination device that illuminates a liquid crystal display element is disclosed in Japanese Unexamined Patent Application Publication 10-50124. The technology to use an organic EL element, having a linear pattern, for a light source to illuminate the liquid crystal display device from its front side, or for a light source of a back light to illuminate the liquid crystal display device from its reverse side, is disclosed in this Japanese Unexamined Patent Application Publication.

SUMMARY OF THE INVENTION

However, problems exist in the above-described prior art technology. For example, the current supplied to the organic EL element must be increased in order to improve the brightness of the illumination light, which reduces the service life of the organic EL element since the temperature of the element rises as the current is increased.

Accordingly, an object of the present invention is to provide an illumination device that reduces the current supplied to the organic EL element in order to solve these problems.

The following organic EL light sources are provided in accordance with the invention.

An organic EL light source in accordance with an aspect of the invention includes a first organic EL element having at least one light emitting layer that is formed on a first surface of a transparent substrate that is subject to light transmissivity and light conductivity, and a second organic EL element having at least one light emitting layer that is formed on a second surface opposite to the above first surface.

In the above-described structure, the light source is formed of the organic EL element using a thin film material, and the light source can be reduced in profile and in size. In addition, a display device on which the light source is mounted can be reduced in profile and in size.

The second organic EL element can be formed at a position opposite to the above-described first organic EL element. Specifically, a light outgoing surface of the first organic EL element and a light outgoing surface of the second organic EL element can be opposite to each other.

In the above-described structure, at least two organic EL elements are formed on one substrate, and the current supplied to one element to realize a light source of the same brightness as that of a light source having one element can be reduced. Thus, advantages achieved include increasing the service life of the element, i.e., the light source, and saving power. When the same current as that of the light source having one element is supplied to the element, a brighter light source can be provided.

The above-described organic EL element can be sealed.

In the above-described structure, the service life of the element can be increased by sealing the element using a sealing member such as a seal substrate.

Portions, except at least one end face of the above-described transparent substrate, can be covered by a mirror.

In the above-described structure, the light leakage from a surface, except a surface from which the light of the light source emits, is prevented, and the light can be efficiently taken out by covering a mirror, in particular, a mirror or the like high in reflectance.

A light emitting layer of the above-described organic EL element can be striped shaped.

In the above-described structure, the organic EL light source can be reduced in profile and in size by forming a striped-shaped element, and when the organic EL light source is mounted on a liquid crystal display device or the like, the liquid crystal display device can be reduced in size.

At least two organic EL elements can be formed on at least one of the above-described first and second surfaces.

In the above-described structure, the light source can easily provide multi-color and white color light by forming at least two organic EL elements on one surface.

Two organic electroluminescent elements can be formed on one of the above-described first surface and the above-described second surface.

In the above-described structure, the higher brightness and the multi-color light of the light source can be realized more easily compared with the light source having one or two elements, since at least three organic EL elements are provided. Further, a white light source can be easily obtained by forming the organic EL elements so as to include three kinds of light emissions, i.e., red light emission, green light emission and blue light emission.

Two organic electroluminescent elements can be respectively formed on the above-described first surface and the above-described second surface.

In the above-described structure, the higher brightness and the multi-color light of the light source can be realized more easily compared with the light source having one, two or three elements, since four organic EL elements are provided. A white light source of higher brightness compared with the above light source, including the two organic electroluminescent elements formed on one of the first and second surfaces, can be obtained by forming the organic EL elements so as to include three kinds of light emissions, i.e., red light emission, green light emission and blue light emission.

Three organic electroluminescent elements can be respectively formed on the above-described first surface and the above-described second surface.

In the above-described structure, the much higher brightness and more multi-color lights of the light source can be realized more easily compared with the light source having one to five elements since six organic EL elements are provided. A white light source of much higher brightness compared with the above light sources, including the two organic electroluminescent elements formed on one or both of the first and second surfaces, can be obtained by forming the organic EL elements so as to include three kinds of light emissions, i.e., red light emission, green light emission and blue light emission.

BRIEF DESCRIPTION OF THE DRAWINGS

FIG. 2 is a perspective cross-sectional view of a structure of an organic electroluminescent light source according to a second embodiment of the present invention.

FIG. 3 is a perspective cross-sectional view of a structure of an organic electroluminescent light source according to a third embodiment of the present invention.

FIG. 4 is a perspective cross-sectional view of a structure of an organic electroluminescent light source according to a fourth embodiment of the present invention.

DETAILED DESCRIPTION OF PREFERRED EMBODIMENTS

The embodiments of the present invention will be described below in detail.

[First Embodiment]

Figure 1A:
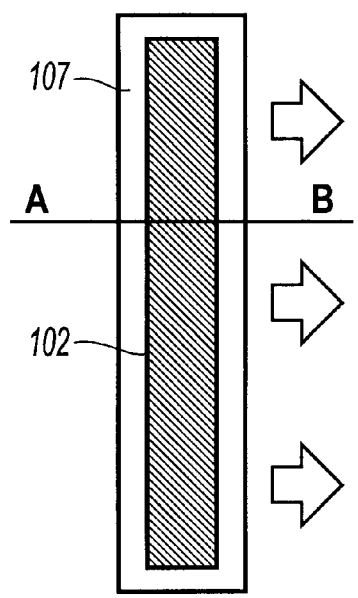
FIG. 1(*a*) is a plan view of an organic electroluminescent light source according to a first embodiment of the present invention, and FIG. 1(*b*) is a cross-sectional view taken along plane A-B of FIG. 1(*a*).
Figure 1B:
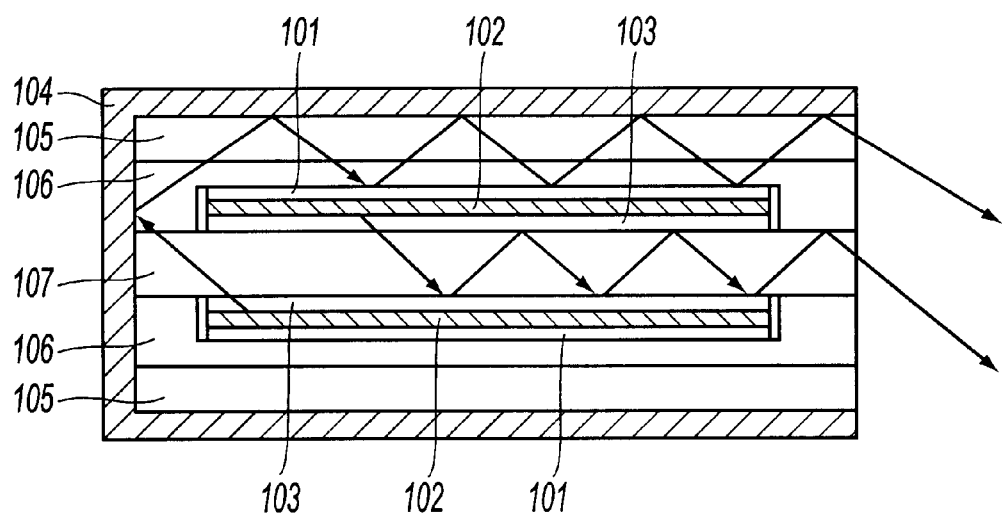

FIG. 1(*a*) is a plan view of a structure of an organic EL light source according to a first embodiment of the present invention, and FIG. 1(*b*) is a cross-sectional view taken along plane A-B of FIG. 1(*a*). Certain components in FIG. 1(*a*) are omitted to simplify the figure.

An organic EL light source in accordance with the present embodiment includes a structural body (an organic EL element). An anode 103 is provided on both sides of a transparent substrate 107 that is subject to light transmissivity and light conductivity. At least one organic layer (a light emitting layer) 102, which emits light, and a cathode 101 are laminated together and sealed by a transparent or translucent substrate 105 through an adhesive 106. This structure is further covered by a mirror 104 which is high in reflectance except for one end face of the mirror.

In the present embodiment, for example, a general soda glass is used for the transparent substrate 107 which is subject to light transmissivity and light conductivity. However, a glass material of quartz type, multi-components type, rare earth element doped quartz type, and rare earth element doped multi-components type may also be used.

The anode 103 is often used for an electrode on the light take-out side (the light outgoing side), and a transparent or translucent electrode material is preferably used. In the present embodiment, ITO (Indium Tin-doped Oxide) is used for the transparent electrode, and IZO (Indium Zinc-doped Oxide), ZnO, $SnO_2$, $In_2O_3$, etc. can be used.

The thickness of the anode 103 is preferably, for example, in a range of 50 to 500 nm, and more preferably, in a range of 50 to 300 nm. When the anode is excessively thick, the transmissivity can be degraded, or the anode can be separated. On the other hand, if the anode is too thin, the electrode cannot operate sufficiently, and a problem may occur with regard to the film strength during manufacture.

The organic layer 102 which emits light is preferably and functionally separated into a hole transport layer, a light emission layer, and an electron transport layer. In the present embodiment, a thin film that has a film thickness of 50 nm is formed for the hole transport layer through the vacuum vapor deposition of N,N'-diphenyl-N,N'-dinaphthyl- 1,1'-biphenyl-4,4'-diamine. A thin film having a thickness of 50 nm is formed on the above-described hole transport layer through the vacuum vapor deposition of the tris (8-hydroxy quinoline) aluminum complex which is generally known as an electron transport light emitting material. However, the organic material that can be used in the organic layer is not limited thereto.

The structure of the organic layer is also not limited thereto. For example, a hole injection layer can be introduced between an anode and a hole transport layer, or a very thin insulation layer can be introduced as an electron injection layer between a cathode and an electron transport layer. Further, a trace of fluorescent dye can be introduced in the hole transport layer and the electron transport layer, and the light color can be freely selected by the fluorescent dye to be introduced.

The thickness of the organic layer is not specially limited. However, the thickness of the organic layer is generally 5 to 500 nm, and more preferably, 10 to 300 nm, although the thickness may be different depending on the method of forming the layer.

The pattern (shape in plan view) of an organic layer 102 is preferably striped shape. For example, the striped shape may extend about 1 mm in width and about 40 mm in length.

A method of forming the organic layer which emits light can be selected among various film forming methods, including the sputtering system, the spin coat system, the dipping system and the ink jet system in addition to the vacuum vapor deposition system.

The cathode 101 may be formed of any electrically conductive substance. In the present embodiment, a cathode of 200 nm in film thickness is formed using an alloy in which magnesium and silver are mixed at the ratio of 10:1 through vacuum vapor deposition.

The material for the cathode is not limited thereto. For example, the material can include a single metal, such as one of Al, Ti, Ta, K, Li, Na, La, Ce, Ca, Sr, Ba, In, Sn, Zn and Zr, or a two-component and three-component alloy containing these single metals.

The thickness of the cathode is generally in a range of 1 to 500 nm, and more preferably, in a range of 50 to 300 nm.

The material of the seal substrate 105 includes a flat and transparent or translucent material. In the present embodiment, a general soda glass is used. However, the material is not limited thereto, and lead alkali glass, borosilicate glass, aluminosilicate glass, silica glass, quartz, resin, etc. can also be used therefore.

A polymer adhesive, which is transparent or translucent, and resistant to water permeability, is generally used for the adhesive 106, which adheres to the seal substrate 105. In the present embodiment, a photo-curable epoxy resin is used. However, the material is not limited thereto, and a thermo-setting epoxy resin can also be used.

The material of the mirror 104, which is high in reflectance, includes a metal having a high reflectance, such as silver and/or aluminum. In the present embodiment, the mirror is formed by winding a polyester film on which silver is vapor deposited.

The light leakage from portions, except for an end face of a transparent substrate, which are original locations to emit the light, is prevented by forming the mirror which is high in reflectance, and the light emitted from the organic EL element can be effectively used.

The organic EL light source formed according to the present embodiment emits the light only from the end face, as illustrated in FIGS. 1(a) and (b), and forms a linear light source which is high in brightness.

The organic EL element emits diversified light colors depending on the light emitting material that is used. In the present embodiment, the organic EL element is formed on both sides of the transparent substrate, which is subject to light transmissivity and light conductivity. Thus, a light which is brighter than light emitted from a light source with the organic EL element which is formed only on one side can be obtained for each color ranging from blue to red.

Further, in the present embodiment, at least three colors can be easily synthesized by combining the organic EL elements to emit the different colors of light.

In the present embodiment, the organic EL element can freely control the brightness by the drive power. Thus, a color having smooth color gradation can be easily synthesized by combining the organic EL elements to emit different colors and controlling the drive power.

The organic EL element can also emit white light by the above forming method. Thus, in the present embodiment, a white light source which is high in brightness can be obtained. This white light source can be used for an excellent illumination of a full-color liquid crystal display device or the like.

[Second Embodiment]

FIG. 2 is a perspective cross-sectional view of a schematic construction of an organic EL light source according to a second embodiment of the present invention.

The second embodiment is an organic EL light source having three organic EL elements in total on both sides of the transparent substrate 107, which is subject to light transmissivity and light conductivity. This organic EL light source is provided with an organic EL element 200R having an organic layer 201R that emits red light on one side, and an organic EL element 200B having an organic layer 201B that emits blue light and an organic EL element 200G having an organic layer 201G that emits green light on the opposite side continuously relative to each other. Similar components to those of FIG. 1 are represented by similar reference numbers.

In the present embodiment, the light emitting area of the organic EL element that emits red light is large so as to increase the quantity of red light because it is difficult to provide a red light emitting organic EL element that is higher in brightness.

The disposition of each organic EL element according to the second embodiment is not limited to that in FIG. 2. However, taking into consideration that it is difficult to provide a red light emitting organic EL element that is higher in brightness, it seems effective to increase the light emitting area of the red light emitting organic EL element to obtain the white light.

The organic EL light source according to the second embodiment can be used for excellent illumination for a full-color liquid crystal display device since it emits the white light that is high in brightness.

[Third Embodiment]

FIG. 3 is a perspective cross-sectional view of a schematic of an organic EL light source according to a third embodiment of the present invention.

The third embodiment is an organic EL light source has four organic EL elements on both sides of the transparent substrate 107 which is subject to light transmissivity and light conductivity. This organic EL light source is provided with an organic EL element 300R that has an organic layer 201R that emits red light and an organic EL element 300B that has an organic layer 201B that emits blue light on one side continuously with respect to each other, and the organic EL element 300R and an organic EL element 300G that has an organic layer 201G that emits green light on the other side continuously with respect to each other. Similar components to those of FIGS. 1 and 2 are represented by similar reference numbers.

The organic EL light source of the third embodiment has two organic EL elements that emit red light. This is because it is difficult to provide a red light emitting organic EL element that is higher in brightness, and thus the quantity of red light is increased by providing two light emitting sources.

The disposition of each organic EL element according to the third embodiment is not limited to that shown in FIG. 3. However, taking into consideration that it is difficult to provide a red light emitting organic EL element that is higher in brightness, it seems effective to install two red light emitting organic EL elements to obtain white light.

The organic EL light source according to the third embodiment can be used for excellent illumination for a full-color liquid crystal display device since it emits the white light high in brightness.

[Fourth Embodiment]

FIG. 4 is a perspective cross-sectional view of a schematic of an organic EL light source according to a fourth embodiment of the present invention.

An organic EL light source according to the fourth embodiment has six organic EL elements on both sides of the transparent substrate 107 which is subject to light transmissivity and light conductivity. This organic EL light source is provided with an organic EL element 400R that has an organic layer 201R that emits red light, an organic EL element 400G that has an organic layer 201G that emits green light and an organic EL element 400B that has an organic layer 201B that emits blue light on each side continuously with respect to each other. Similar components to those of FIGS. 1–3 are represented by similar reference numbers.

In the organic EL light source according to the fourth embodiment, the organic EL elements are formed in the RGB in a striped shape on both sides of the substrate, and the brightness of each color can be finely adjusted to obtain excellent white light.

The disposition of each organic EL element according to the fourth embodiment is not limited to that shown in FIG. 4. However, taking into consideration that it is difficult to provide a red light emitting organic EL element that is higher in brightness, it seems effective to install the red light emitting organic EL elements closest to the end face from which the light is outputted to obtain the white light.

The organic EL light source according to the fourth embodiment can be used as an excellent illumination for a full-color liquid crystal display device since it emits the white light high in brightness.

[Advantages]

As described above, the organic EL light source of the present invention is a linear light source which is high in brightness and capable of realizing multi-colors, including the white color, making use of a characteristic that the light source is formed on both sides of the substrate, and a feature that the light source includes organic EL elements. Thus, an image that is high in brightness and sharp and clear can be displayed not only in a full-color liquid crystal display device but also in a monochrome display device. Further, an inverter circuit, a transformer, etc. can be obviated, the organic EL light source can be driven with small power, the drive circuit can be simplified, and the system can be reduced in size. In addition, an image that is free from any irregularity in color or brightness and visually excellent can be displayed by providing a linear light source compared with a display device using a prior art LED point light source.

What is claimed is:

1. An organic electroluminescent light source comprising:
   a transparent substrate defining a first surface and an opposite second surface, the transparent substrate being subject to light transmissivity and light conductivity;
   a first organic electroluminescent element having at least one light emitting layer that is formed on the first surface of the transparent substrate;
   a second organic electroluminescent element having at least one light emitting layer that is formed on the second surface of the transparent substrate; and
   a mirror that covers the transparent substrate except for at least one end face of said transparent substrate.

2. The organic electroluminescent light source according to claim 1, wherein the second organic electroluminescent element is formed at a position opposite to said first organic electroluminescent element relative to the transparent substrate.

3. The organic electroluminescent light source according to claim 1, wherein said first and second organic electroluminescent elements are sealed.

4. The organic electroluminescent light source according to claim 1, wherein the light emitting layer of each of said first and second organic electroluminescent elements is striped shaped.

5. The organic electroluminescent light source according to claim 1, further including a third organic electroluminescent element formed on said first surface of the transparent substrate.

6. The organic electroluminescent light source according to claim 5, further including a fourth organic electroluminescent element formed on said second surface of the transparent substrate.

7. The organic electroluminescent light source according to claim 6, further including fifth and sixth organic electroluminescent elements respectively formed on said first surface and said second surface of the transparent substrate.

8. A method of emitting light from an organic electroluminescent light source, comprising the steps of:
   emitting light from at least one light emitting layer, of a first organic electroluminescent element, that is formed on a first surface of a transparent substrate that is subject to light transmissivity and light conductivity;
   emitting light from at least one light emitting layer, of a second organic electroluminescent element, that is formed on a second surface of the transparent substrate that is opposite to the first surface;
   reflecting the light by a mirror covering the transparent substrate except for at least one end face thereof; and
   outputting the light from the at least one end face of the transparent substrate.

* * * * *